United States Patent
Kye et al.

(10) Patent No.: US 6,906,777 B1
(45) Date of Patent: Jun. 14, 2005

(54) PELLICLE FOR A LITHOGRAPHIC LENS

(75) Inventors: Jongwook Kye, Pleasanton, CA (US); Carl P. Babcock, Campbell, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/790,412

(22) Filed: Mar. 1, 2004

(51) Int. Cl.[7] .................. G03B 27/32; G03B 27/52; G03B 27/54
(52) U.S. Cl. .................. 355/30; 355/67; 355/77
(58) Field of Search ................ 355/30, 67, 77

(56) References Cited

U.S. PATENT DOCUMENTS

| 5,696,623 A | * 12/1997 | Fujie et al. ............ 359/350 |
| 6,731,378 B2 | 5/2004 | Hibbs .................. 355/75 |
| 2004/0091796 A1 | * 5/2004 | Nagata ................ 430/5 |

* cited by examiner

Primary Examiner—Rodney Fuller
(74) Attorney, Agent, or Firm—Renner, Otto, Boisselle & Sklar, LLP

(57) ABSTRACT

A method and apparatus for preventing contamination in a lithographic apparatus including a projection system, including providing the lithographic apparatus including the projection system for imaging an irradiated portion of a mask onto a target portion of a substrate and placing a pellicle over a surface of the projection system to inhibit contamination of the surface.

21 Claims, 1 Drawing Sheet

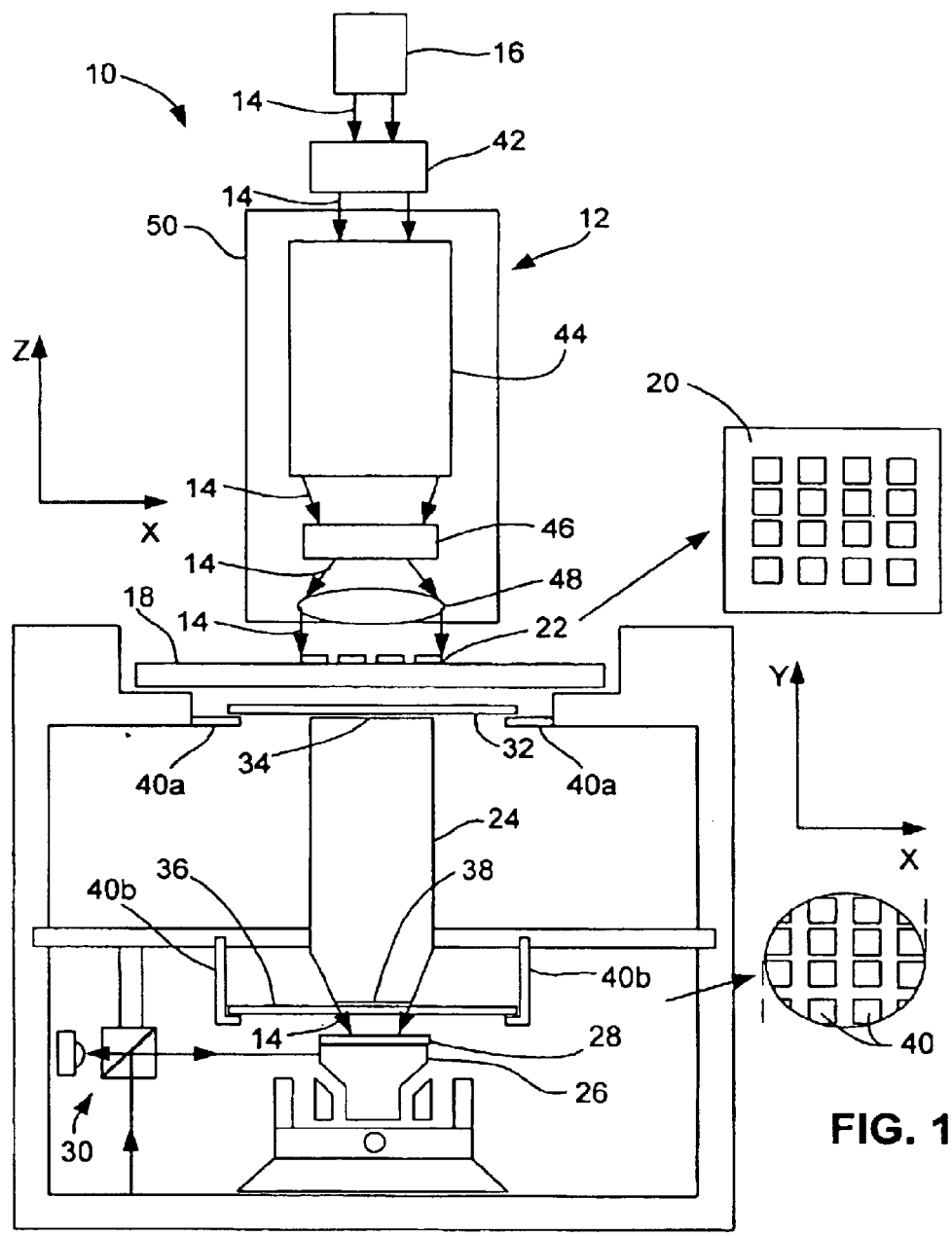
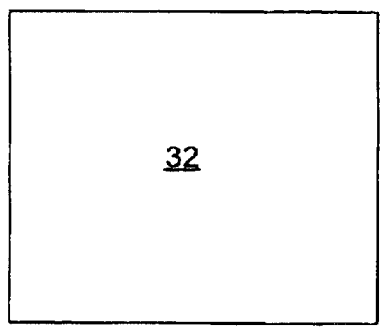
FIG. 2a
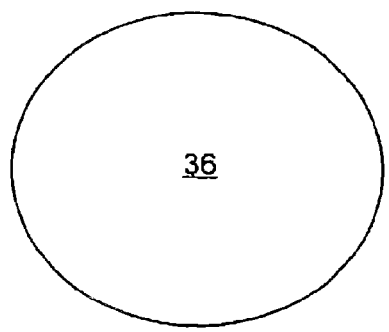
FIG. 2b

PELLICLE FOR A LITHOGRAPHIC LENS

TECHNICAL FIELD

The present invention generally relates to a lithographic lens and, more specifically, relates to a pellicle for a lithographic lens.

BACKGROUND ART

Lithographic apparatus can be used, for example, in the manufacture of integrated circuits (ICs). In such a case, a mask utilized in the photolithography process may contain a circuit pattern corresponding to an individual layer of the IC, and this pattern can be imaged onto a target portion (e.g., comprising one or more dies) on a substrate (silicon wafer) that has been coated with a layer of radiation-sensitive material. In general, a single wafer will contain a whole network of adjacent target portions that are successively irradiated via a projection system, one at a time.

In one type of lithographic projection apparatus, each target portion is irradiated by exposing the entire mask pattern onto the target portion in one go; such an apparatus is commonly referred to as a wafer stepper. In an alternative apparatus-commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction. In general, the projection system will have a magnification factor M (generally <1). The speed V at which the substrate table is scanned will be a factor M times that at which the mask table is scanned. More information with regard to lithographic devices as here described can be found, for example, in U.S. Pat. No. 6,046,792, which is incorporated herein by reference.

In a manufacturing process using a lithographic projection apparatus, the mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC.

Such a patterned layer may then undergo various processes such as etching, ion-implantation (doping), metallization, oxidation, chemical mechanical polishing, etc., all intended to finish off an individual layer. If several layers are required, then the whole procedure, or a variant thereof, will be repeated for each new layer. Eventually, an array of devices will be present on the substrate (wafer).

These devices are then separated from one another by a technique such as dicing or sawing. Subsequently, the individual devices can be mounted on a carrier, connected to pins, etc. Further information regarding such processes can be obtained, for example, from the book *"Microchip Fabrication: A Practical Guide to Semiconductor Processing"*, Third Edition, by Peter van Zant, McGraw Hill Publishing Co., 1997, ISBN 0-07-067250-4, incorporated herein by reference.

For the sake of simplicity, the projection system may hereinafter be referred to as the "lens". However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Of course, one of the goals in integrated circuit fabrication is to faithfully reproduce the original design on the wafer (via the mask). As the demand to image smaller and smaller features in the semiconductor manufacturing process has continued unabated, the limitations of optical lithography that were once accepted have been exceeded repeatedly. However, printing smaller features on a chip requires improving the resolution of the optical system by increasing the numerical aperture and/or decreasing the exposure wavelength. For this reason, the wavelength of microlithographic tools has progressed from historic g-line (436 nm) and I-line (365 nm) to the recent KrF (248 nm) and ArF (193 nm) laser generations, with 157 nm slated to follow. Beyond 157 nm, the use of transmissive optical materials becomes impractical and the next generation of tools will require reflective optics and an extreme UV (EUV) light source at 13.4 nm.

The optical material requirements for these lithographies are highly dependent on whether the material is used for laser optics, illumination systems, photomasks, projection optics, or inspection tools. Common to all is a need for outstanding transmission (or reflection, in the case of EUV). Depending on the type of optic, this requirement can stem simply from the need for high throughput; however, in the case of projection optics, contamination on a surface of a lens may also cause errors in the image projected onto the substrate, which in turn may result in defective devices or degraded device performance. For example, contamination that attaches to a lens surface may cause unwanted scattering of the illumination source. In some cases, the scattering causes a feature (closed space) to form in an image where an open space should be or vice versa In some cases, the projection characteristics of the lens are significantly degraded. For example, a lens with significant degradation may produce features with a critical dimension greater than the design specifications.

Further, a significant amount of time may be spent in removing contamination from surfaces of the lithographic lens. Even with routine cleaning over a period of time, a significant amount of contamination may build up on a surface of the lithographic lens requiring the lens to be replaced.

As such, there is a need for preventing or inhibiting contamination that attaches to a surface of the lithographic lens from adversely affecting an image projected by the lithographic lens.

DISCLOSURE OF INVENTION

According to one aspect of the invention, the invention relates to a method of preventing contamination in a lithographic apparatus including a projection system. The method includes the steps of providing the lithographic apparatus with the projection system for imaging an irradiated portion of a mask onto a target portion of a substrate, and placing a pellicle over a surface of the projection system to inhibit contamination of the surface.

According to another aspect of the invention, the invention relates to a lithographic apparatus, including a projection system for imaging an irradiated portion of a mask onto a target portion of a substrate and a pellicle placed over a surface of the projection system to inhibit contamination of the surface.

According to another aspect of the invention, the invention relates to a lithographic apparatus including a radiation system for supplying a projection beam of radiation, a mask table including a mask holder for holding a mask connected to a positioner for accurately positioning the mask with respect to a projection system, a substrate table including a substrate holder for holding a substrate connected to the positioner for accurately positioning the substrate with respect to the projection system, and a pellicle placed over a surface of the projection system to inhibit contamination of the surface, the projection system for imaging an irradiated portion of the mask onto a target portion of the substrate.

Thus, the present invention, by providing a pellicle for a lithographic lens, overcomes the problem of contamination of a surface of the lithographic lens, particularly during projection of an image onto a substrate during a lithographic process. The present invention provides advantages such as (1) formation of precise lithographic images on a subsstrate; (2) protection of a top surface and/or a bottom surface of a lithographic lens from significant contamination; (3) provision of a scattering determining process modification which can be easily accommodated in presently employed fabrication processes; (4) significantly reduces the amount of time spent in removing contamination from surfaces of the lithographic lens; (5) relatively easy replacement of the pellicle for the lithographic lens thereby extending the useful life of the lithographic lens and (6) preventing the formation of undesirable features in a lithographic image projected onto a substrate. Thus, the present invention provides an advance in photolithography technology, and insures formation of features of semiconductor devices with precision, while at the same time providing distinct process and economic advantages. Although described in terms of, and particularly applicable to, transmissive optical materials, the present invention is broadly applicable to reflective optics.

BRIEF DESCRIPTION OF DRAWINGS

FIG. 1 schematically illustrates, in cross-section, a lithographic projection apparatus including lens pellicles in accordance with an embodiment of the present invention.

FIGS. 2a and 2b schematically illustrate, a top view of lens pellicles in accordance with an embodiment of the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

Furthermore, it should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

MODES FOR CARRYING OUT THE INVENTION

Referring first to FIG. 1, there is schematically shown in cross-section a lithographic projection apparatus 10 suitable for use with the method of the present invention. The apparatus 10 includes a radiation system 12 for supplying a projection beam 14 of radiation. In this particular case, the radiation system 12 also includes a radiation source 16. A first object table (mask table) 18 is provided with a mask holder 20 for holding a mask 22 (e.g., a reticle). The first object table 18 is connected to a first positioning means (not shown) for accurately positioning the mask 22 with respect to a projection system 24. A second object table (substrate table) 26 is provided with a substrate holder (not shown) for holding a substrate 28 (e.g., a resist-coated silicon wafer). The second object table 26 is connected to a second positioning means 30 for accurately positioning the substrate 28 with respect to the projection system 24.

A first pellicle 32 is positioned between the projection system 24 and the first object table 18. The first pellicle 32 prevents or inhibits contamination from attaching and building up on a top surface 34 of the projection system 24. A second pellicle 36 is positioned between the projection system 24 and the substrate 28. The second pellicle 36 prevents or inhibits contamination from attaching to and building up on a bottom surface 38 of the projection system 24. By preventing and reducing the build up of contamination on one or more surfaces of the projection system 24, the pellicles 32 and 36 reduce the adverse effects caused by scattering of the beam 14 during the projection process. Further, the ability to replace the pellicles 32 and 36 independently increases the useful life of the projection system 24.

The projection system ("lens") 24 is for imaging an irradiated portion of the mask 22 onto a target portion 40 of the substrate 28. The projection system ("lens") 24 may be a refractive, catoptric or catadioptric optical system, for example. The target portion 40 may comprise one or more dies.

As depicted herein, the apparatus 10 is of a transmissive type. That is, the apparatus 10 includes a transmissive mask. However, in general, the apparatus 10 may also be of a reflective type. That is, the apparatus 10 may use a reflective mask, for example. Alternatively, the apparatus 10 may employ another kind of patterning means as an alternative to the use of a mask; examples include a programmable mirror array or LCD matrix.

The radiation source 16 produces the beam 14 of radiation. The radiation source 16 may be a mercury lamp or excimer laser, for example. The beam 14 is fed into the illumination system 12 (also referred to herein as the illuminator 12), either directly or after having traversed conditioning means, such as a beam expander 42, for example. The illuminator 12 may comprise adjusting means 44 for setting an outer and/or an inner radial extent (commonly referred to as sigma-outer and sigma-inner, respectively) of the intensity distribution in the beam 14. In addition, the illuminator 12 will generally comprise various other components, such as an integrator 46 and a condenser 48. In this way, the beam 14 impinging on the mask 22 has a desired uniformity and intensity distribution in its cross-section.

It should be noted with regard to FIG. 1 that the radiation source 16 may be within a housing 50 of the lithographic projection apparatus 10 when the radiation source 16 is a mercury lamp, for example. In another embodiment, the radiation source 16 may be remote from the lithographic projection apparatus 10. In this embodiment, the radiation beam 14 produced is directed into the apparatus 10. For example, suitable directing mirrors may be used to guide the radiation beam 14. The latter embodiment is often the case when the radiation source 16 is an excimer laser (e.g., based on KrF, ArF or $F_2$ lasing). The current invention encompasses both of these embodiments.

The beam 14 subsequently illuminates the mask 20, which is held on the mask table 18. The portion of the beam 14 passing through the mask 20 then passes through the lens 24, which focuses the beam 14 onto the target portion 40 of the substrate 28. With the aid of the second positioning means 30 (for example, an interferometric measuring means), the substrate table 26 can be moved accurately, e.g., so as to position different target portions 40 in the path of the beam 14. Similarly, the first positioning means (not shown) can be used to accurately position the mask 20 with respect to the path of the beam 14, e.g., after mechanical retrieval of the mask 20 from a mask library, or during a scan. In general, movement of the object tables 18, 26 will be realized with the aid of a long-stroke module (coarse positioning) and a short-stroke module (fine positioning), which are not explicitly depicted in FIG. 1. However, in the case of a wafer stepper (as opposed to a step-and-scan tool) the mask table 18 may just be connected to a short stroke actuator, or may be fixed.

The depicted tool can be used in two different modes. In step mode, the mask table 18 is kept essentially stationary, and an entire mask image 20 is projected in one go (i.e., a single "flash") onto a target portion 40. The substrate table 26 is then shifted in the x and/or y directions so that a different target portion 40 can be irradiated by the beam 14.

In scan mode, essentially the same scenario applies, except that a given target portion 40 is not exposed in a single "flash". Instead, the mask table 18 is movable in a given direction (the so-called "scan direction", e.g., the y direction) with a speed v, so that the projection beam 14 is caused to scan over a mask image 20; concurrently, the substrate table 26 is simultaneously moved in the same or opposite direction at a speed V=Mv, in which M is the magnification of the lens 24 (typically, M=¼ or ⅕). In this manner, a relatively large target portion 40 can be exposed, without having to compromise on resolution.

Now with reference to FIGS. 2a and 2b, the first and second pellicles 32 and 36 will be described. It should be understood by those have ordinary skill in the art that an embodiment described with relation to one pellicle may be used or modified to be used with the other pellicle. The first and second pellicles 32 and 36 may be a hard pellicle or a soft pellicle as further described below. The first and second pellicles 32 and 36 may have a width or diameter between about 250 mm and about 350 mm. A hard pellicle will have a thickness to prevent distortion, e.g., (bowing of the pellicle) due to gravity. A hard pellicle may have a thickness between about 0.5 mm and about 1.5 mm. A hard pellicle may have a thickness between about 0.75 mm and about 1.25 mm. A hard pellicle may have a thickness between about 1.0 mm and 1.25 mm. A soft pellicle may have a thickness between about 10 microns and about 50 microns. A soft pellicle may have a thickness between about 20 microns and 40 microns. A soft pellicle may have a thickness between about 25 microns and 35 microns. Those having ordinary skill in the art will understand that the ranges are exemplary and ranges between the maximum and minimum ranges disclosed are included, e.g. a hard pellicle may have a thickness between about 0.83 mm and about 1.17 mm.

The first and second pellicles 32 and 36 in projection systems may be selected optical glass or synthetic fused silica for 365-nm, and synthetic fused silica for 248-nm, 193-nm and 157 nm. $CaF_2$ may be used for some elements at 193 nm, and as the primary material at 157 nm.

Fused, or vitreous, silica is the material of choice for most 248-nm, many 193-nm and some 157 nm applications because it provides an economical combination of optical transmission, laser damage resistance, and refractive index homogeneity. The industry also has a large cumulative body of experience in polishing this glass. The fused silica pellicles provide about 95% of transmission at 157 nm and about 98% of transmission at 193 nm.

The physical properties of fused silica are controlled by thermal history and by trace levels of impurities and structural defects. Fused silica is a very viscous material compared to other common commercial glasses and must be processed at temperatures in excess of 1800° C. The high temperatures limit the options for working or homogenizing the fused silica without introducing metal contaminants. Metal contaminants may degrade UV transmission.

The tight lithographic specifications for UV transmission translate into the need to control metal contaminants at the parts-per-billion level. Key to meeting this purity requirement is the use of chemical precursors, such as organic siloxanes or $SiCl_4$, because these materials can be distilled to levels of very high purity.

The precursor vapor is normally fed into the hydrogen/oxygen or natural gas/oxygen flame, where it reacts to form a stream of fine silica particles. These particles can be captured, depending on the temperature of the deposition zone, as a dense glass or as a porous body. Both approaches use special thermal treatments such as reflow and slow anneals to control index homogeneity, birefringence, and changes induced by prolonged UV exposure.

Non-metallic contaminants also impact the optical properties of fused silica, in both positive and negative fashions. Molecular hydrogen provides benefits for laser damage resistance, acting as a passivating agent for induced transmission change. Molecular hydrogen performs this task mainly by reacting with and altering the absorption properties of the defects that occur during prolonged exposure to UV radiation so that the defects do not absorb light at the eventual exposure wavelengths. Concentration of molecular hydrogen is usually established during glass formation or in post-forming impregnation steps.

Fluorine may be added to improve transmission and laser damage resistance properties, especially at 157 nm. Fluorine may eliminate the strained bond sites that are most readily damaged under UV exposure.

Chlorine is detrimental to UV transmission. The chlorine-free precursors do not generate hydrochloric acid as a manufacturing byproduct or leave residual chlorine in the fused silica. If chlorine remains after forming or chemical drying, the chlorine may be removed prior to consolidation with flushing treatments.

As mentioned above, $CaF_2$ may be used in an apparatus 10 using a 157 nm illumination source 16. Although single crystals of various fluorides such as $CaF_2$, $MgF_2$, and so on are difficult to produce in high quality and quantity, $CaF_2$ and $MgF_2$ offer high deep-UV transparency, which results from their large bandgap. $CaF_2$ and $MgF_2$ are also highly resistant to laser damage, with transmission only weakly dependent upon laser fluence. Among these fluorides, $CaF_2$ is the most commonly used for microlithography applications.

Although $CaF_2$ exhibits cubic crystal symmetry, its optical behavior is not identical in all orientations. The photon wave vector introduces a term that effectively disrupts symmetry in the crystal, hence introducing intrinsic birefringence. Cubic crystals are optically isotropic only in the limit in which the wavelength of light is infinite compared with interatomic dimensions. At visible wavelengths this is an excellent approximation, but at UV wavelengths such as 193 nm, the atomic crystalline structure influences light differently for different propagation directions; thus, the intrinsic birefringence. Accordingly, a $CaF_2$ pellicle must be oriented along a crystallographic orientation to compensate for intrinsic birefringence. In addition to intrinsic effects, stress-induced birefringence is also an important consideration that may vary with orientation and fabrication process.

A $CaF_2$ pellicle is between about 250 mm and 350 mm in diameter or width. The $CaF_2$ pellicle is between about 10 microns and about 900 microns thick. The predominant method for producing these large crystals is the Bridgman or Bridgman-Stockbarger technique. The critical nature of crystal quality dictates an extremely slow growth rate that allows elimination of trapped gases and the expulsion of impurities, as well as the reduction of slip and mosaic defects. Cooling or annealing the crystals after growth in a manner that controls thermal gradients minimizes these defects, as well as stress-induced birefringence and other optical inhomogeneities. Manufacturers typically grow crystals under high vacuum to eliminate ambient gas contamination, especially oxygen.

One of the most common types of imperfections in $CaF_2$ is dislocations. Dislocations are linear structures that occur in most crystalline materials as a result of the stresses exerted on the material during solidification and/or annealing. $CaF_2$ dislocations, however, are more complex due to the necessity of charge balance. Annealing eliminates dislocations by causing dislocations to coalesce into 2-D structures called subgrain boundaries. X-ray analysis confirms that the crystallographic orientation of the $CaF_2$ structure shifts spatially across the subgrain boundary. Despite the orientation shift, subgrain boundary formation actually reduces stress within the $CaF_2$ crystal, decreasing stress-induced birefringence.

In another embodiment, soft pellicles made of fluorocarbon polymers are used. The fluorocarbon polymer pellicles are designed to maintain their transparency while being irradiated at 193 nm or 157 nm.

The following description of the operational use of present invention follows with reference to FIG. 1.

Initially, the lithographic projection apparatus 10 is provided. The lithographic projection apparatus 10 includes the radiation system 12 for supplying the projection beam 14 of radiation. The radiation system 12 also includes the radiation source 16. The first object table 18 is provided with the mask holder 20 holding the mask 22. The first object table 18 is connected to the first positioning means (not shown). The first positioning means is used to accurately position the mask 22 with respect to the projection system 24. The second object table (substrate table) 26 is provided with the substrate holder (not shown) holding the substrate 28 (e.g., a resist coated silicon wafer). The second object table 26 is connected to the second positioning means 30. The second positioning means 30 is used to accurately position the substrate 28 with respect to the projection system 24.

Next, the pellicle 32 is placed over the top surface 34 of the lens 24. The pellicle 32 may be placed on a moveable mounting means 40a, a movable pellicle table, for example. The moveable mounting means 40a can be inserted into the lithographic projection apparatus 10 such that the pellicle 32 is positioned over the top surface 34 of the lens 24 in close proximity to the top surface 34. For example, the first pellicle 32 may be positioned, for example, within about 1 mm to about 8 mm, within about 3 mm to about 6 mm, within about 5 mm to about 8 mm or the like. The movable mounting means 40a is configured to allow the pellicle 32 to be easily removed and/or replaced when a surface of the pellicle 32 is contaminated to such an extent that the contamination adversely affects the image projected on the substrate 28. Additionally, the movable mounting means 40a allows the pellicle 32 to be moved out of the way of the top surface 34 of the lens 24 to allow the top surface 34 to be cleaned.

Next, a pellicle 36 is placed over a bottom surface 38 of the lens 24. The pellicle 36 may be placed or mounted on a second moveable mounting means 40b, a second movable pellicle table, for example. The second moveable mounting means 40b will position the pellicle 36 in close proximity to the bottom surface 38 of the lens 24. That is, the moveable mounting means 40b can translate in the Y direction and the Z direction in order to position the second pellicle 36, e.g., within about 8 mm, within about 3 mm to about 6 mm, within about 5 mm to about 8 mm, or the like of the bottom surface 38 of the lens 24. Now the lithographic apparatus 10 is used as described above in the manufacturing of integrated circuits.

Subsequently, an inspection process may be done on the substrate 28. The inspection process is used to determine whether contamination on the pellicle 32 over the top surface 34 and/or contamination on the pellicle 36 over the bottom surface 38 has caused the formation of an undesirable feature on a target area of the semiconductor wafer 28. An undesirable feature would be a closed area where an open area should be or vice versa, for example.

Another method that may be used to determine the level of contamination on the pellicle 32 or the pellicle 36 is to determine the scattering effect due to contamination on the pellicles 32 and 36. If the scattering caused by contamination on either pellicle exceeds a pre-specified criteria, it is understood by those having ordinary skill in the art, that such contamination could cause undesirable scattering in the projection beam 14. Thus, undesirable features may result in the target area of a wafer or substrate 28.

If one or both pellicles 32 and 36 have contamination that adversely affects the image projected on the substrate 28, the pellicle or pellicles may be replaced. For example, the moveable mounting means 40a may be removed or partially removed from the lithographic projection apparatus 10 and the pellicle 32 with contamination thereon can be removed from the moveable mounting means 40a. A new pellicle 32 can be mounted onto the moveable mounting means 40a. The moveable mounting means 40a can then be reinserted into the lithographic projection apparatus 10 as described above.

Alternatively, the second moveable mounting means 40b may be removed or partially removed from the lithographic projection apparatus 10 and the pellicle 36 with contamination thereon can be removed from the second movable mounting means 40b. A new pellicle 36 can be mounted onto the second mounting means 40b and the second mounting means 40b can be reinserted into the lithographic projection apparatus 10 as described above.

Accordingly, the first pellicle 32 and the second pellicle 36 can be used in the lithographic projection apparatus 10 to prevent or inhibit contamination from forming on the top surface 34 and/or the bottom surface 38. The reduction in contamination forming on or attaching to the top surface 34 and/or the bottom surface 38 reduces the undesirable effects of scattering of the radiation beam 14 during a projection process during the manufacturing of a semiconductor device. By independently monitoring the effects of the contamination that may build up on the surface of the pellicle 32 and/or the pellicle 36, the pellicle 32 and/or the pellicle 36 can be replaced independently when contamination reaches a pre-specified criteria. Thus, the useful life of the lens 24 can be extended.

INDUSTRIAL APPLICABILITY

Thus, the present invention, by providing a pellicle for a lithographic lens, overcomes the problem of contamination of a surface of the lithographic lens, particularly during projection of an image onto a substrate during a lithographic process. The present invention provides advantages such as (1) formation of precise lithographic images on a substrate; (2) protection of a top surface and/or a bottom surface of a lithographic lens from significant contamination; (3) provision of a scattering determining process modification which can be easily accommodated in presently employed fabrication processes; (4) significantly reduces the relatively easily replacement of the pellicle for the lithographic lens thereby extending the useful life of the lithographic lens and (6) preventing the formation of undesirable features in a lithographic image projected onto a substrate. Thus, the present invention provides an advance in photolithography technology, and insures formation of features of semiconductor devices with precision, while at the same time providing distinct process and economic advantages.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the pellicle can be varied from that described herein. It is therefore intended to include within the invention all such variations and modifications that fall within the scope of the appended claims and equivalents thereof.

What is claimed is:

1. A method of preventing contamination in a lithographic apparatus including a projection system, comprising:
providing the lithographic apparatus including the projection system for imaging an irradiated portion of a mask onto a target portion of a substrate; and
placing a pellicle over a surface of the projection system to inhibit contamination of the surface,
wherein the placing of the pellicle is accomplished by a moveable mounting means that translates into the lithographic apparatus in order to position the pellicle in close proximity to the surface of the projection system.

2. The method of claim 1, wherein the pellicle comprises a fluorine polymer.

3. The method of claim 1, wherein the pellicle comprises a fused silica.

4. The method of claim 1, including the step of:
replacing the pellicle when a scattering of an illumination source reaches a specified criteria.

5. The method of claim 1, including the step of:
illuminating the lithographic apparatus with an illumination light of a wavelength of between about 190 nm and 250 nm.

6. The method of claim 1, including the step of:
illuminating the lithographic apparatus with an illumination light of a wavelength of between about 155 nm and 190 nm.

7. The method of claim 1, wherein the surface of the projection system is at last one of a top surface and bottom sure.

8. The method of claim 2, wherein the surface is the top surface of the projection system.

9. The method of claim 1, wherein the surface is the bottom surface of the projection system.

10. The method of claim 3, wherein the projection system includes at least two lenses,
the top surface of the projection system is a top surface of a top lens, and
the bottom surface of the projection system is a bottom surface of a bottom lens.

11. A lithographic apparatus, comprising:
a projection system for imaging an irradiated portion of a mask onto a target portion of a substrate;
a pellicle placed over a surface of the projection system to inhibit contamination of the surface, and
a moveable mounting means that translates into the lithographic apparatus in order to position the pellicle in close proximity to the surface of the projection system.

12. A lithographic apparatus according to claim 11, wherein the pellicle comprises a fluorine polymer.

13. A lithographic apparatus according to claim 11, wherein the pellicle comprises a fused silica.

14. A lithographic apparatus according to claim 11, wherein the pellicle is replaceable.

15. A lithographic apparatus according to claim 11, including:
an illumination light of a wavelength of between about 190 nm and 250 nm.

16. A lithographic apparatus according to claim 11, including:
an illumination light of a wavelength of between about 155 nm and 190 nm.

17. A lithographic apparatus according to claim 11, wherein the surface of the projection system is at least one of a top surface and bottom surface.

18. A lithographic apparatus according to claim 17, wherein the surface is the top surface of the projection system.

19. A lithographic apparatus according to claim 17, wherein the surface is the bottom surface of the projection system.

20. A lithographic apparatus according to claim 17, wherein the projection system includes at least two lens,
the top surface of the projection system is a top surface of a top lens, and
the bottom surface of the projection system is a bottom surface of a bottom lens.

21. A lithographic apparatus comprising:
a radiation system for supplying a projection beam of radiation;
a mask table including a mask holder for holding a mask connected to a positioner for accurately positioning the mask with respect to a projection system;
a substrate table including a substrate holder for holding a substrate connected to the positioner for accurately positioning the substrate with respect to the projection system;
a pellicle placed over a surface of the projection system to inhibit contamination of the surface; and
a moveable mounting means that translates into the lithographic apparatus in order to position the pellicle in close proximity to the surface of the projection system,
the projection system for imaging an irradiated portion of the mask onto a target portion of the substrate.

* * * * *

UNITED STATES PATENT AND TRADEMARK OFFICE
CERTIFICATE OF CORRECTION

PATENT NO.    : 6,906,777 B1
DATED         : June 14, 2005
INVENTOR(S)   : Kye et al.

It is certified that error appears in the above-identified patent and that said Letters Patent is hereby corrected as shown below:

Column 2,
Line 48, replace "vice versa In" with -- vice versa. In --.

Column 3,
Line 29, replace "subsstrate" with -- substrate --.

Column 9,
Line 20, replace "reduces the relatively" with -- reduces the amount of time spent in removing contamination from surfaces of the lithographic lens; (5) relatively --.
Line 66, replace "last" with -- least --.
Line 67, replace "sure" with -- surface --.

Signed and Sealed this

Sixteenth Day of August, 2005

JON W. DUDAS
*Director of the United States Patent and Trademark Office*